(12) United States Patent
Hatamian et al.

(10) Patent No.: US 8,788,998 B2
(45) Date of Patent: Jul. 22, 2014

(54) NON-INTEGER HEIGHT STANDARD CELL LIBRARY

(71) Applicant: Broadcom Corporation, Irvine, CA (US)

(72) Inventors: Mehdi Hatamian, Irvine, CA (US); Paul Penzes, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/725,870

(22) Filed: Dec. 21, 2012

(65) Prior Publication Data

US 2014/0181774 A1    Jun. 26, 2014

(51) Int. Cl.
 *G06F 17/50* (2006.01)
(52) U.S. Cl.
 USPC ............................. 716/122; 716/119; 716/126
(58) Field of Classification Search
 CPC ............ G06F 17/5068; G06F 17/5072; G06F 17/5077; G06F 17/5045; G06F 17/5081; G06F 17/505; G06F 17/5054; H05K 3/30035
 USPC .......................................... 716/119, 122, 126
 See application file for complete search history.

(56) References Cited

U.S. PATENT DOCUMENTS

| 7,917,885 | B2 * | 3/2011 | Becker | 716/137 |
| 2005/0044522 | A1 * | 2/2005 | Maeda | 716/18 |
| 2009/0283915 | A1 * | 11/2009 | Becker | 257/776 |
| 2010/0115484 | A1 * | 5/2010 | Frederick | 716/10 |
| 2011/0156103 | A1 * | 6/2011 | Penzes | 257/211 |
| 2012/0241986 | A1 * | 9/2012 | Sherlekar et al. | 257/784 |
| 2012/0249182 | A1 * | 10/2012 | Sherlekar | 326/101 |
| 2013/0042216 | A1 * | 2/2013 | Loh et al. | 716/119 |
| 2013/0100731 | A1 * | 4/2013 | Chuang et al. | 365/154 |

* cited by examiner

*Primary Examiner* — Vuthe Siek
*Assistant Examiner* — Magid Dimyan
(74) *Attorney, Agent, or Firm* — McDermott Will & Emery LLP (57) ABSTRACT

A standard cell library for designing integrated circuits is provided. In some aspects, the standard cell library includes a plurality of standard cells having a cell height that is a non-integer multiple of a wiring pitch of routing tracks associated with the standard cell library. The standard cell library further includes a plurality of landing pins for connecting to the routing tracks arranged in the plurality of standard cells, wherein each of the plurality of landing pins is extended by half of the wiring pitch in opposite directions orthogonal to an orientation of the routing tracks.

13 Claims, 6 Drawing Sheets

NON-INTEGER HEIGHT STANDARD CELL LIBRARY

FIELD

The subject technology generally relates to standard cell libraries, and in particular, relates to designs of standard cell libraries having non-integer cell heights.

BACKGROUND

Standard cells are often specified to have a height that is an integer multiple of a minimum wiring pitch. This sizing makes a maximum number of wiring channels available for routing once the standard cells have been placed in a design. However, this sizing may provide more area in the standard cells than necessary to meet timing and/or power requirements. Furthermore, reductions in transistor size (e.g., fin-based field effect transistor (FINFET) spacing) may not optimally align with the minimum wiring pitch. Accordingly, maintaining standard cell height as an integer multiple of a minimum wiring pitch may result in a standard cell library that is oversized and consumes more power than necessary.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

In the following detailed description, numerous specific details are set forth to provide a full understanding of the subject technology. It will be apparent, however, that the subject technology may be practiced without some of these specific details. In other instances, structures and techniques have not been shown in detail so as not to obscure the subject technology.

According to various aspects of the subject technology, a non-integer height standard cell library is provided. The non-integer height standard cell library presents connectivity challenges in making sure that landing pins in a standard cell can be properly connected to the wiring channels or tracks in any row placement (e.g., NS placement and SN placement). Due to the non-integer height of the standard cells, the position of the landing pins relative to the tracks may change depending on the placement. To ensure proper connectivity to the routing tracks, the landings pins are extended at both ends of the landing pins in a direction orthogonal to the orientation of the tracks. For example, the landing pins may be extended by a length equal to half of the minimum wiring pitch at each end.

Figure 1:
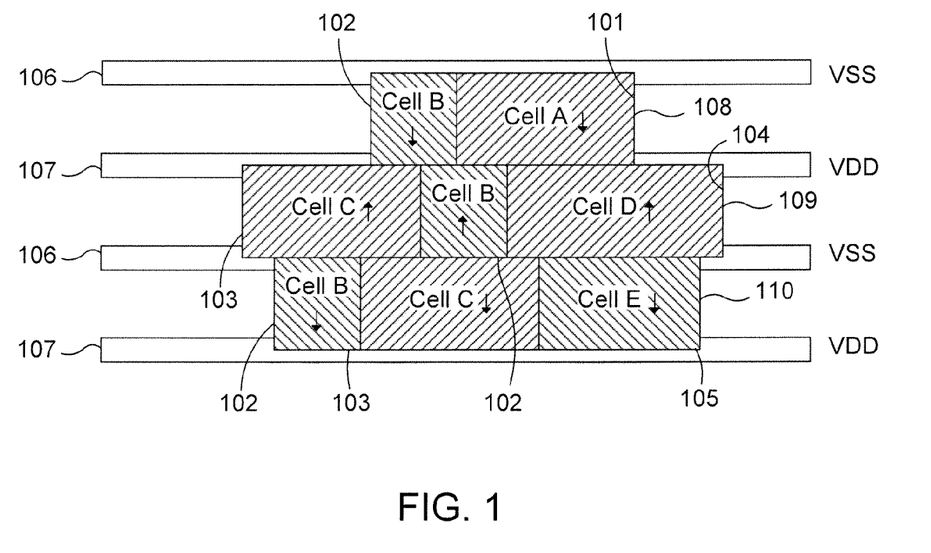
FIG. 1 illustrates an example of multiple rows of standard cells, where each row has an orientation opposite of an orientation of rows adjacent to the respective row, in accordance with various aspects of the subject technology.

FIG. 1 illustrates an example of multiple rows of standard cells, where each row has an orientation opposite of an orientation of rows adjacent to the respective row, in accordance with various aspects of the subject technology. As shown in FIG. 1, standard cells 101-105 are arranged into three rows 108-110. Row 108 contains standard cells 101 and 102, row 109 contains standard cells 102, 103, and 104, and row 110 contains standard cells 102, 103, and 105. Standard cells that are arranged in each row have an orientation, as designated by an up arrow or a down arrow. As shown in FIG. 1, row 108 and 110 are South-North tiled, whereas, row 109 is adjacent to both rows 108 and 110 and is North-South tiled. This arrangement enables each row of standard cells to be connectable to power rails (VSS and VDD) 106 and 107. Furthermore, each standard cell 101-105 is designed to include one or more transistors (e.g., fin-based field effect transistors (FINFETs), etc.) and each standard cell is powered by power rails 106 and 107.

Multiple routing tracks (not shown in FIG. 1) are arranged across the standard cells 101-105 and are used to interconnect the one or more transistors of standard cells 101-105 via multiple landing pins. For a standard cell that has a height that is an integer multiple of the wiring pitch of routing tracks that are arranged across the standard cell, landing pins of the standard cell remain connectable to the routing tracks when the orientation of the standard cell is reversed. If a standard cell has a non-integer track height, reversing the orientation of the standard cell (e.g., from a North-South orientation to a South-North orientation) may alter relative positions of landing pins of the standard cell with respect to the routing tracks arranged across the standard cell. This issue is compounded in designs that contains multiple rows of standard cells, where each row has an orientation opposite of an orientation of rows adjacent to the respective row. As a result, one or more landing pins of a standard cell may not be connectable to any routing track once the routing tracks are arranged across the standard cell.

This design issue may be eliminated if the standard cell is designed to have a cell height that is an integer multiple of a pitch of the routing tracks. In a standard cell that has a cell height that is an integer multiple of the pitch of the routing tracks, the relative offset of a routing track from the top or the bottom of the cell is identical. However, restricting the height of the standard cell to having an integer multiple of the pitch of the routing tracks may cause the standard cell to take up additional space, which could lead to an increase of power consumption and/or timing delays.

Figure 2:
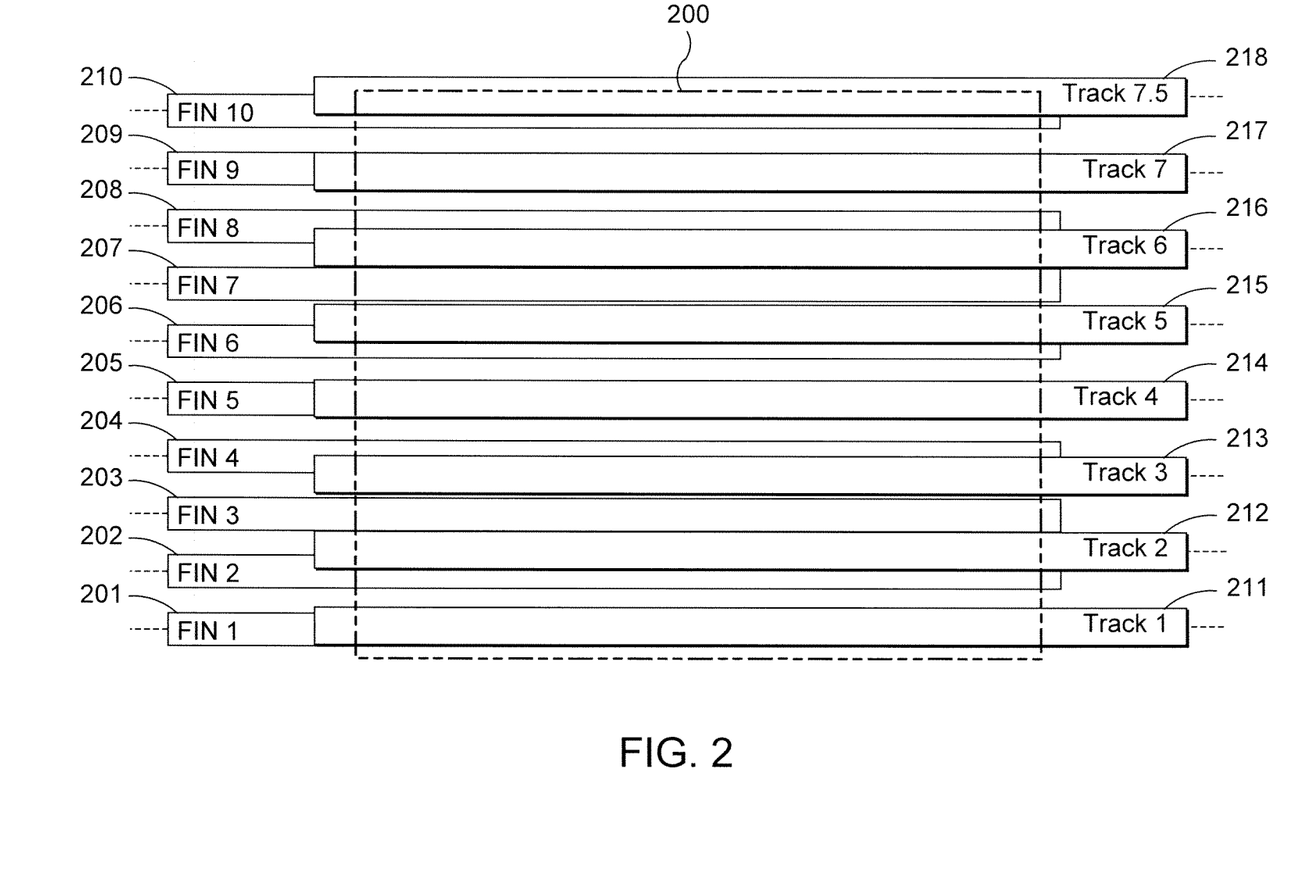
FIG. 2 is an illustration of a standard cell design having a non-integer track height, in accordance with various aspects of the subject technology.

FIG. 2 is an illustration of a standard cell design having a non-integer track height in accordance with various aspects of the subject technology. As shown in FIG. 2, standard cell 200 is designed to include 10 rows of FINFETs 201-210. Routing tracks 211-218, which are used to facilitate communication between standard cell 200 and other standard cells, are arranged across standard cell 200. Landing pins (not shown) are placed throughout standard cell 200, where each of the landing pins is connected to at least one of routing tracks 211-218 to provide routing capabilities to the FINFETs 201-210.

Routing tracks that are arranged across a standard cell may have a wiring pitch that is proportional to a fin pitch of the FINFETs of the standard cell. Furthermore, both the wiring pitch of the routing tracks that are arranged across the standard cell and the fin pitch of the FINFETs of the standard cell may be a divisor of the standard cell height. For example, if a standard cell is designed to include FINFETS that have a fin pitch of 48 nm and routing tracks that have a 64 nm pitch are arranged across the standard cell to interconnect the FINFETs, then the standard cell can be designed to include 16 rows of FINFETs and 12 rows of routing tracks can be arranged across the standard cell. In this configuration, connectivity of the standard cell is maintained if the standard cell's orientation with respect to the routing tracks is reversed. However, connectivity may no longer be maintained if routing tracks that have a different wiring pitch are arranged on the standard cell and/or FINFETs that have a different fin pitch are used in the standard cell. Furthermore, if routing tracks that have a different wiring pitch and/or FINFETs that have a different fin pitch are used, optimizing cell height for one pitch may not be ideal for the other pitch, and may result in a loss of connectivity.

As shown in FIG. 2, standard cell 200 is designed to include 10 rows of FINFETs. Assuming that the fin pitch (distance between hash lines that extend from adjacent rows of FINFETs 201-210) between adjacent rows of FINFETs is 48 nm and routing tracks that have a 64 nm pitch (distance between hash lines that extend from adjacent rows of routing tracks 211-218) are used to interconnect the FINFETs, a standard cell that has a non-integer height that is 7.5 times the wiring pitch of the routing tracks and includes 10 rows of FINFETs could be implemented.

As shown in FIG. 2, routing tracks 211-217, which correspond to Tracks 1-7, and routing track 218, which corresponds to track 7.5 are arranged across standard cell 200. In this case, the wiring pitch of the routing tracks associated with standard cell library 200 are not divisors of the height of standard cell 200. As shown in FIG. 2, routing track 218 overlaps standard cell 200's boundaries and routing track 211 has an offset that is a half a wiring pitch from the boundaries of standard cell 200. If standard cell 200's orientation is reversed, the offset may cause some FINFETs of the standard cell to no longer be ideally aligned with wiring tracks that are arranged across standard cell 200, thereby limiting connections options. One remedy is to extend landing pins that interconnect routing tracks 211-218 to the FINFETs.

Figure 3A:
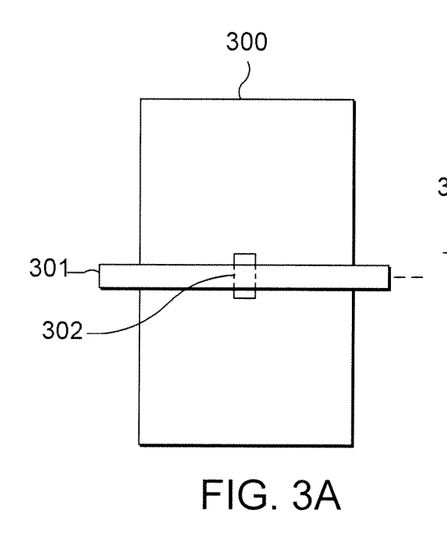
FIG. 3A is an illustration of a standard cell design, in accordance with various aspects of the subject technology.

FIG. 3A is an illustration of a standard cell design, in accordance with various aspects of the subject technology. As shown in FIG. 3A, standard cell 300 includes landing pin 302. Landing pin 302 is connected to routing track 301, which is arranged across standard cell 300. In order to ensure proper connectivity to routing track 301, design rules may require an overlap between landing pin 302 and routing track 301 so that landing pin 302 extends beyond routing track 301. While standard cell 300 includes one landing pin and one routing track for illustration purposes only, other examples of standard cell designs may include multiple rows of routing tracks connected to multiple landing pins.

Figure 3B:
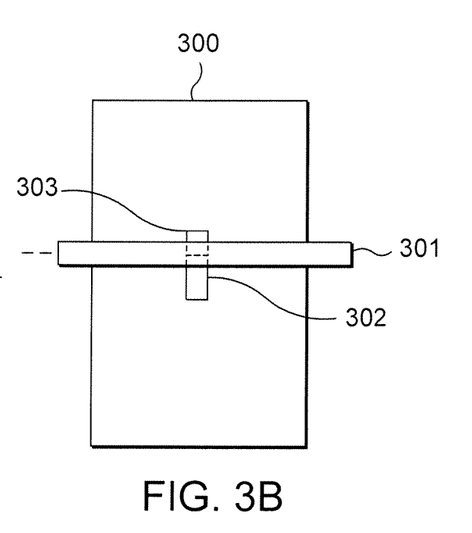
FIG. 3B is an illustration of the standard cell of FIG. 3A where the relative position of routing track with respect to landing pin is shifted by one half of a wiring pitch, in accordance with various aspects of the subject technology.

FIG. 3B is an illustration of the standard cell of FIG. 3A where the relative position of routing track 301 with respect to landing pin 302 is shifted by one half of a wiring pitch, in accordance with various aspects of the subject technology. According to example aspects, an inversion of the orientation of a standard cell having a non-integer cell height may cause a shift of relative positions of one or more routing tracks that are arranged across to the standard cell with respect to one or more landing pins of the standard cell. As shown in FIG. 3B, an inversion of standard cell 300 attributed to a shift of routing track 301's relative position with respect to landing pin 302. In the illustration of FIG. 3B, landing pin 302 and routing track 301 partially overlap due to the shifting of routing track 301's relative position with respect to landing pin 302. This partial overlap violates the design rules and may cause a loss of connectivity between landing pin 302 and routing track 301.

In order to ensure proper connectivity between landing pin 302 and routing track 301, the relative position of landing pin 302 to routing track 301 must be shifted and/or landing pin 302 must be extended to provide sufficient overlap with routing track 301. As shown in FIG. 3B, an extension 303 to landing pin 302 is added to ensure proper connectivity to routing track 301. As shown in FIG. 3B, extension 303 extends landing pin 302 through routing track 301 (shown by portions of the additional contacts represented by dash lines), and beyond (shown by portions of the additional contacts represented by solid lines). Furthermore, if routing track 301 is shifted by one half of a wiring pitch in the opposite direction with respect to landing pin 302, the shift would also cause landing pin 302 and routing track 301 to partially overlap.

Figure 3C:
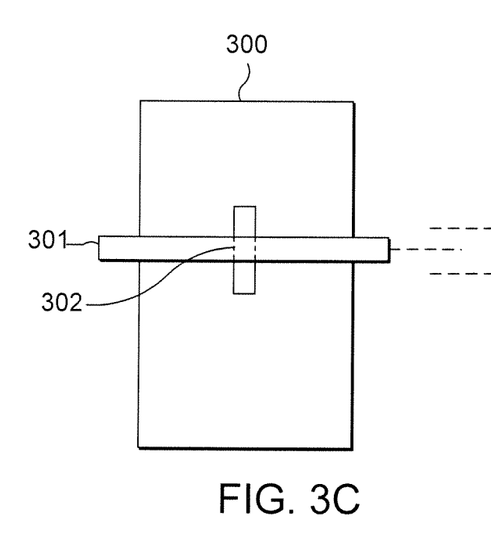
FIG. 3C is an illustration of the standard cell of FIG. 3A, where the landing pin is extended by one half of a pitch in opposite directions, in accordance with various aspects of the subject technology.

FIG. 3C is an illustration of the standard cell of FIG. 3A, where landing pin 302 is extended by one half of a wiring pitch in opposite directions, in accordance with various aspects of the subject technology. According to example aspects, a landing pin may be extended in opposite directions orthogonal to the orientation of a routing track. As shown in FIG. 3C, landing pin 302 is extended by one half of the wiring pitch in both directions orthogonal to routing track 301. Additional routing tracks that are arranged across standard cell 300 are not shown in FIG. 3C. By extending landing pin 302 by one half of the wiring pitch in opposite directions, landing pin 302 is guaranteed to be connectable to at least one routing track regardless of which direction the landing pin is shifted with respect to the relative positions of the routing tracks. Furthermore, by extending landing pin 302 by one half of the wiring pitch in opposite directions, landing pin 302 is guaranteed to connect to at least one routing track regardless of the size of the shift between landing pin 302 and the relative positions of the routing tracks that are arranged across standard cell 300. According to example aspects, landing pin 302 may be extended by any non-integer increment with respect to one or both directions orthogonal to the direction of the routing track. However, in order to connect landing pin 302 to at least one routing track, landing pin 302 would need to be extended by a minimum of one half of the wiring pitch in both directions.

Figure 3D:
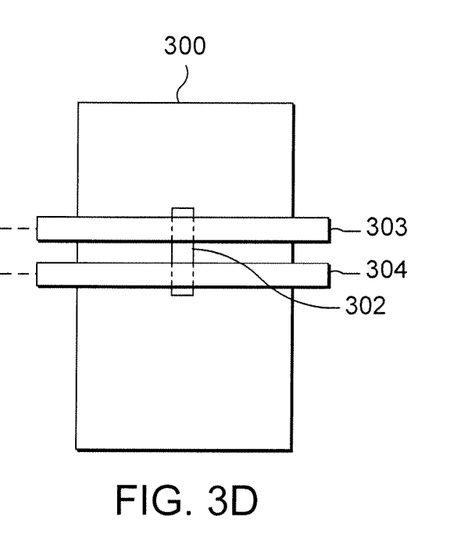
FIG. 3D is an illustration of the standard cell of FIG. 3C, where the landing pin is capable of connecting to two routing tracks and, and where the relative positions of the two routing tracks with respect to landing pin are one half of a wiring pitch shifted from the relative position of the routing track of FIG. 3C with respect to the landing pin of FIG. 3C, in accordance with various aspects of the subject technology.

FIG. 3D is an illustration of the standard cell of FIG. 3C, where the landing pin 302 is capable of connecting to two routing tracks 303 and 304, and where the relative positions of the two routing tracks 303 and 304 with respect to landing pin 302 are one half of a wiring pitch shifted from the relative position of routing track 301 of FIG. 3C with respect to landing pin 302 of FIG. 3C, in accordance with various aspects of the subject technology. As shown in FIG. 3D, routing tracks 303 and 304 are positioned half a wiring pitch away from the location of routing track 301. Additional routing tracks that are arranged across standard cell 300 are not shown in FIG. 3D.

According to example aspects, relative positions of routing tracks 303 and 304 to landing pin 302 are each one half of a wiring pitch shifted from the relative position of routing track 301 to landing pin 302 of FIG. 3C. In this case, both routing tracks 303 and 304 remain connected to extended landing pin 302. According to other example aspects, where the position of landing pin 302 is shifted by another non-integer value with respect to the positions of the routing tracks, landing pin 302 is guaranteed to connect to at least one routing track. This connection may occur at locations where routing tracks 303 or 304 are connected to landing pin 302 or at any other location with respect to landing pin 302. Therefore, landing pin 302 may still provide routing capabilities to transistors even if a shift of the relative position of landing pin 302 with respect to the positions of the routing tracks that are arranged across standard cell 300-occurs. Therefore, a standard cell design can accommodate a shift of the relative positions of routing tracks associated with the standard cell with respect to landing pins of the standard cell by extending the landing pins by one half of the wiring pitch in both directions orthogonal to the directions of the routing tracks that are arranged across the standard cell.

Figure 4:
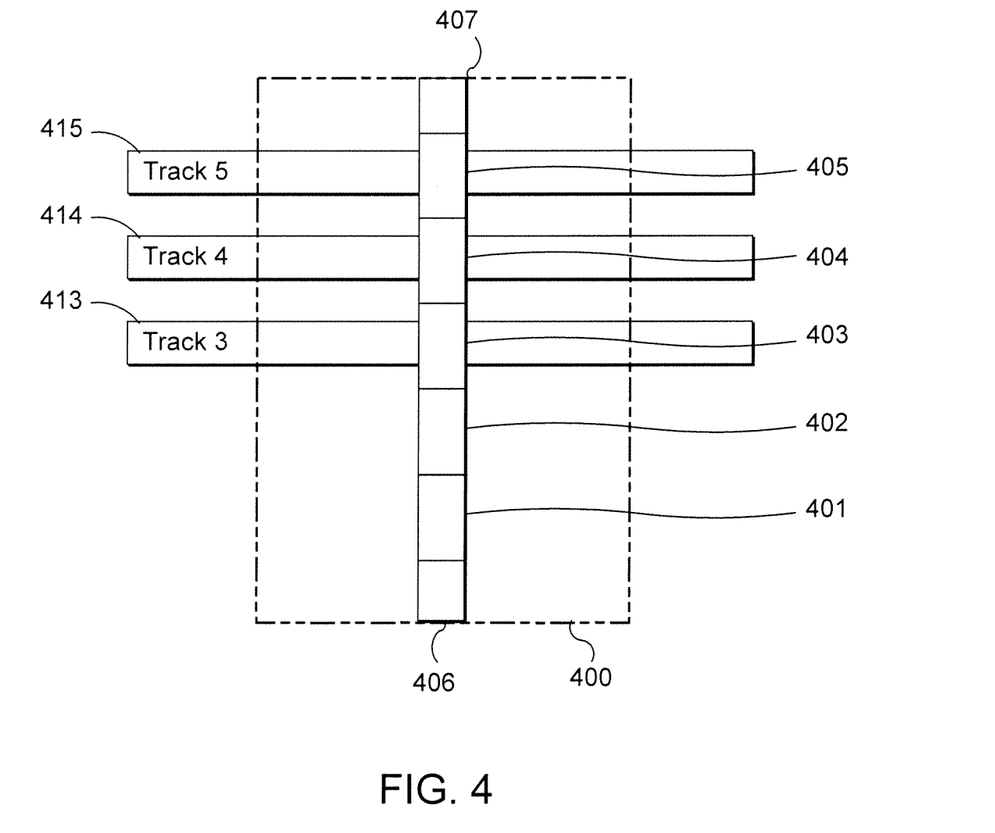
FIG. 4 is an illustration of a standard cell having a non-integer cell height of 7.5 tracks.

FIG. 4 is an illustration of a standard cell having a non-integer cell height. As shown in FIG. 4, standard cell 400 includes landing pins 401-405. As shown in FIG. 4, routing tracks 413-415 are arranged across standard cell 400. Additional routing tracks that are arranged across standard cell 400 are not shown. As shown in FIG. 4, landing pins 401-405 of standard cell 400 are collinearly aligned to form an interconnected column. For such configurations, extensions of landing pins located at each end of the collinearly aligned column of landing pins would ensure that the collinearly aligned column of landing pins is connectable to at least one routing track. Therefore, resource cost to ensure proper connectivity of a standard cell that contains multiple landing pins that are collinearly aligned could be limited to resources required to extend each column of collinearly aligned landing pins by one half of a wiring pitch at each end of the column of collinearly aligned landing pins.

As shown in FIG. 4, landing pins 401 and 405, which are located at the end of the column of landing pins are each outwardly extended by a half of a wiring pitch 406 and 407, respectively. Extensions 406 and 407 allow landing pins 401-405 to be connected to the routing tracks in the standard cell's current orientation. As shown in FIG. 4, only two landing pin extensions, each a half of a pitch of the wiring pitch of routing tracks 413-415 are needed to ensure proper connectivity landing pins 401-405 to the routing tracks that are arranged across standard cell 400. Furthermore, outwardly extending the end of the column landing pins by one half of a wiring pitch ensures that each of standard cell's landing pins is connected to at least one routing tracks are connected if the orientation of the standard cell is reversed.

Figure 5:
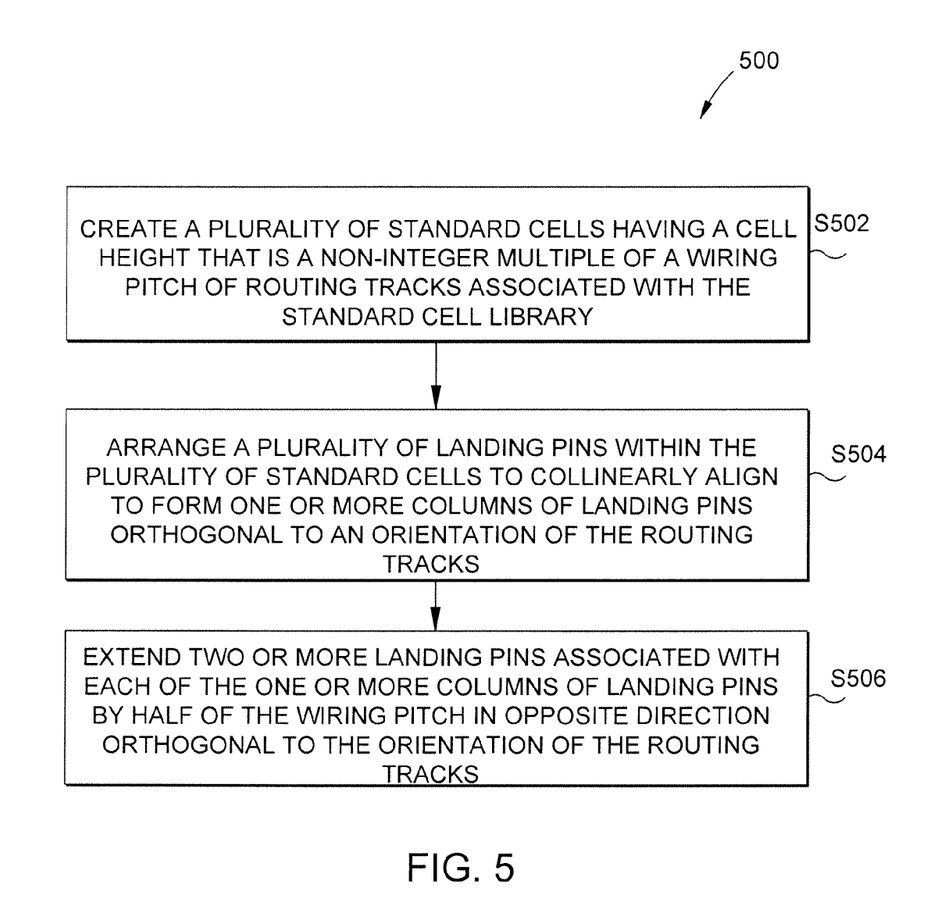
FIG. 5 illustrates an example of a method for designing a standard cell library, in accordance with various aspects of the subject technology.

FIG. 5 illustrates an example of a method for designing a standard cell library, in accordance with various aspects of the subject technology. Although the operations in process 500 are shown in a particular order, certain operations may be performed in different orders or at the same time.

Method 500 includes creating a plurality of standard cells having a cell height that is a non-integer multiple of a wiring pitch of routing tracks associated with the standard cell library (S502). Each of the standard cells are designed to include multiple FINFETs. According to example aspects, the cell height of the standard cells is an integer multiple of a height of the FINFETs associated with the standard cells. Furthermore, FINFETs that are associated with the standard cells have a fin pitch that is not a divisor of the wiring pitch of the routing tracks associated with the standard cell library.

Method 500 further includes arranging a plurality of landing pins within the plurality of standard cells to collinearly align to form one or more columns landing pins orthogonal to an orientation of the routing tracks (S504). In one example aspect, landing pins located at each end of the one or more columns of landing pins are extended by half of the wiring pitch. Method 500 further includes extending two or more landing pins associated with each of the one or more columns of landing pins by half of the wiring pitch in opposite directions orthogonal to the orientation of the routing tracks (S506). Method 500 may further include arranging the standard cells into adjacent rows, where standard cells associated with each row have an orientation that is opposite of an orientation of standard cells in adjacent rows.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

Many of the above-described features and applications may be implemented as firmware or software processes that are specified as a set of instructions recorded on a computer-readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage or electronic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

Figure 6:
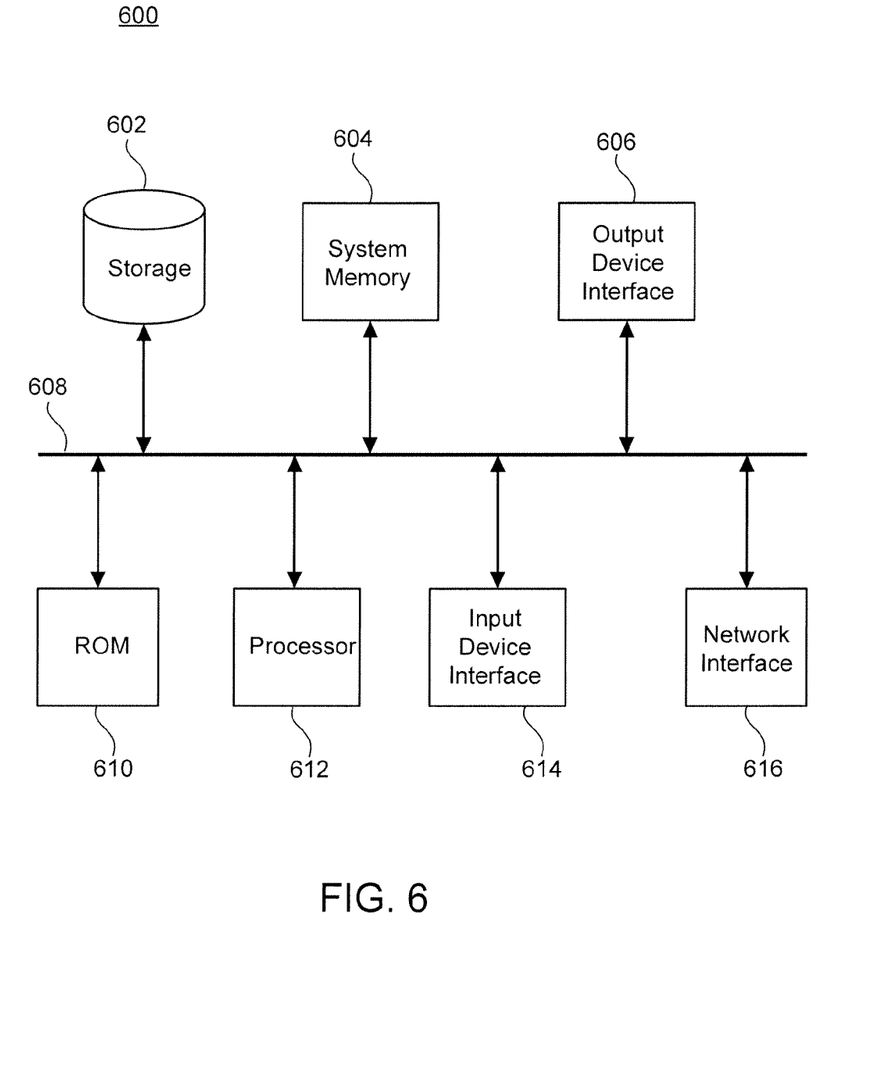
FIG. 6 illustrates an electronic system with which the subject technology may be implemented.

FIG. 6 conceptually illustrates electronic system 600 with which any implementations of the subject technology are implemented. Electronic system 600, for example, can be a desktop computer, a laptop computer, a tablet computer, a server, a switch, a router, a base station, a receiver, a phone, a personal digital assistant (PDA), any device that can implement a standard cell design, or generally any electronic device that transmits signals over a network. Such an electronic system includes various types of computer readable media and interfaces for various other types of computer readable media. Electronic system 600 includes bus 608, processing unit(s) 612, system memory 604, read-only memory (ROM) 610, permanent storage device 602, input device interface 614, output device interface 606, and network interface 616, or subsets and variations thereof.

Bus 608 collectively represents all system, peripheral, and chipset buses that communicatively connect the numerous internal devices of electronic system 600. In one or more implementations, bus 608 communicatively connects processing unit(s) 612 with ROM 610, system memory 604, and permanent storage device 602. From these various memory units, processing unit(s) 612 retrieves instructions to execute and data to process in order to execute the processes of the subject disclosure, for example to design a standard cell library. The processing unit(s) can be a single processor or a multi-core processor in different implementations.

ROM 610 stores static data and instructions that are needed by processing unit(s) 612 and other modules of the electronic system. ROM 610 may contain various standard cell designs and/or instructions for implementing the various standard cell library designs are also stored in ROM 610 and are provided to processor 612 for execution. Permanent storage device 602, on the other hand, is a read-and-write memory device. This device is a non-volatile memory unit that stores instructions and data even when electronic system 600 is off. One or more implementations of the subject disclosure use a mass-storage device (such as a magnetic or optical disk and its corresponding disk drive) as permanent storage device 602.

Other implementations use a removable storage device (such as a floppy disk, flash drive, and its corresponding disk drive) as permanent storage device 602. Storage 602 may contain various standard cell library designs. Like permanent storage device 602, system memory 604 is a read-and-write memory device. However, unlike storage device 602, system memory 604 is a volatile read-and-write memory, such as random access memory. System memory 604 stores any of the instructions and data that processing unit(s) 612 needs at runtime. In one or more implementations, the processes of the subject disclosure are stored in system memory 604, permanent storage device 602, and/or ROM 610. From these various memory units, processing unit(s) 612 retrieves instructions to execute and data to process in order to execute the processes of one or more implementations.

Bus 608 also connects to input and output device interfaces 614 and 606. Input device interface 614 enables a user to communicate information and select commands to implement a standard cell library design to the electronic system. Input devices used with input device interface 614 include, for example, alphanumeric keyboards and pointing devices (also called "cursor control devices"). Output device interface 606 enables, for example, the display of images of standard cell library designs that are generated by electronic system 600. Output devices used with output device interface 606 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 6, bus 608 also couples electronic system 600 to a network (not shown) through network interface 616. In this manner, the computer can be a part of a network of computers (such as a local area network ("LAN"), a wide area network ("WAN"), or an Intranet, or a network of networks, such as the Internet. Any or all components of electronic system 600 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Terms such as "top," "bottom," "front," "rear" and the like as used in this disclosure, if any, should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit designed using a standard cell library, comprising:
    a plurality of standard cells having a cell height that is a non-integer multiple of a wiring pitch of routing tracks associated with the plurality of standard cells, wherein the plurality of standard cells are arranged in a plurality of adjacent rows, and wherein standard cells associated with each row of the plurality of adjacent rows have an orientation that is opposite of an orientation of standard cells associated with adjacent rows of the plurality of adjacent rows, and
    a plurality of landing pins for connecting to the routing tracks arranged in the plurality of standard cells, wherein each of the plurality of landing pins is extended by half of the wiring pitch in opposite directions orthogonal to an orientation of the routing tracks.

2. The integrated circuit of claim 1, wherein the plurality of standard cells comprises one or more fin-based field effect transistors, and wherein the cell height of the plurality of standard cells is an integer multiple of a height of the fin-based field effect transistors.

3. The integrated circuit of claim 2, wherein a fin pitch of the one or more fin-based field effect transistors is not a divisor of the wiring pitch of the routing tracks associated with the standard cell library.

4. The integrated circuit of claim 1, further comprising one or more sets of landing pins collinearly aligned to form one or more columns of landing pins orthogonal to the orientation of the routing tracks.

5. A computer program product comprising instructions stored in a tangible computer-readable storage medium, the instructions comprising:
- instructions for arranging a plurality of standard cells in rows, the plurality of standard cells having a cell height that is a non-integer multiple of a wiring pitch of routing tracks associated with the standard cell library;
- instructions for arranging a plurality of landing pins within the plurality of standard cells to collinearly align to form one or more columns of landing pins orthogonal to an orientation of the routing tracks; and
- instructions for extending two or more landing pins associated with each of the one or more columns of landing pins by half of the wiring pitch in opposite directions orthogonal to the orientation of the routing tracks.

6. The computer program product of claim 5, wherein landing pins located at each end of the one or more columns of landing pins are extended by half of the wiring pitch.

7. The computer program product of claim 5, wherein the plurality of standard cells comprises one or more fin-based field effect transistors, and
wherein the cell height of the plurality of standard cells is an integer multiple of a height of the fin-based field effect transistors.

8. The computer program product of claim 7, wherein a fin pitch of the one or more fin-based field effect transistors is not a divisor of the wiring pitch of the routing tracks associated with the standard cell library.

9. The computer program product of claim 5, further comprising:
- arranging the plurality of standard cells into a plurality of adjacent rows, wherein
- standard cells associated with each row of the plurality of adjacent rows have an orientation that is opposite of an orientation of standard cells associated with adjacent rows of the plurality of layers.

10. An integrated circuit using standard cells of a standard cell library, the integrated circuit comprising:
- a plurality of standard cells having a cell height that is a non-integer multiple of a wiring pitch of routing tracks associated with the standard cell library; and
- a plurality of landing pins for connecting to the routing tracks arranged in the plurality of standard cells, wherein each of the plurality of landing pins is extended by half of the wiring pitch in opposite directions orthogonal to an orientation of the routing tracks.

11. The integrated circuit of claim 10, wherein the plurality of standard cells comprises one or more fin-based field effect transistors, and
wherein the cell height of the plurality of standard cells is an integer multiple of a height of the fin-based field effect transistors.

12. The integrated circuit of claim 11, wherein a fin pitch of the one or more fin-based field effect transistors is not a divisor of the wiring pitch of the routing tracks associated with the standard cell library.

13. The integrated circuit of claim 10, further comprising one or more sets of landing pins collinearly aligned to form one or more columns of landing pins orthogonal to the orientation of the routing tracks.

\* \* \* \* \*